United States Patent [19]

Schwenk

[11] Patent Number: 5,256,833
[45] Date of Patent: Oct. 26, 1993

[54] METAL HOUSING FOR ELECTRONIC DEVICES AND METHOD OF PRODUCING SUCH A HOUSING

[75] Inventor: Hans M. Schwenk, Straubenhardt, Fed. Rep. of Germany

[73] Assignee: Schroff GmbH, Straubenhardt, Fed. Rep. of Germany

[21] Appl. No.: 820,068

[22] Filed: Jan. 9, 1992

[30] Foreign Application Priority Data

Jan. 24, 1991 [DE] Fed. Rep. of Germany ....... 4102019

[51] Int. Cl.$^5$ .............................................. H05K 9/00
[52] U.S. Cl. .................................. 174/35 R; 361/818; 439/609
[58] Field of Search .......... 174/35 GC, 35 R, 35 MS; 361/424; 219/10.55 R, 10.55 D; 439/607, 609, 610, 927; 277/229, 235 R, 236

[56] References Cited

U.S. PATENT DOCUMENTS

| | | | |
|---|---|---|---|
| 3,277,230 | 10/1966 | Stickney et al. | 174/35 GC |
| 3,505,463 | 4/1970 | McAdams | 174/35 GC |
| 4,572,921 | 2/1986 | May et al. | 174/35 GC |
| 5,045,635 | 9/1991 | Kaplo et al. | 174/35 R |
| 5,107,071 | 4/1992 | Nakagawa | 174/35 GC |
| 5,202,536 | 4/1993 | Buonano | 174/35 R |

FOREIGN PATENT DOCUMENTS

| | | |
|---|---|---|
| 3406256 | 8/1985 | Fed. Rep. of Germany . |
| 3642588 | 6/1987 | Fed. Rep. of Germany . |
| 8624817 | 10/1987 | Fed. Rep. of Germany . |
| 3725929 | 2/1989 | Fed. Rep. of Germany . |
| 3815517 | 11/1989 | Fed. Rep. of Germany . |

OTHER PUBLICATIONS

Laser Praxis [Laser Practice]; Jun. 1990, p. 22 "Einfacher arbeiten in jeder Dimension" [Work Easier in every Dimension]; W. Hunziker and A. P. Schwarzenbach.

Laser Praxis [Laser Practice]; Oct. 1990, p. 101 "Reparaturbeschichten von Turbinenschaufeln" [Repair Coating of Turbine Vanes]; K. G. Thiemann, H. Ebsen et al.

Primary Examiner—Leo P. Picard
Assistant Examiner—Bot Ledynh
Attorney, Agent, or Firm—Spencer, Frank & Schneider

[57] ABSTRACT

A metal housing for electronic devices configured for electromagnetic compatibility includes a housing body whose opening can be closed by a closing element. Metal contact faces are provided around the opening at the housing body and correspondingly at the closing element. Thin contact strips of electrically conductive and corrosion resistant metal are applied to the contact faces. These contact strips may be subsequently melted or welded on by means of a laser beam as a weld trace or as a thin metal foil. To seal the groove between the housing body and the closing element against interfering electromagnetic radiation, the contact faces are brought into a good electrically conductive connection with one another by way of the bare metal surfaces of the contact strips applied thereonto, for example by means of an intermediately disposed elastic and electrically conductive seal.

16 Claims, 3 Drawing Sheets

METAL HOUSING FOR ELECTRONIC DEVICES AND METHOD OF PRODUCING SUCH A HOUSING

CROSS REFERENCE TO RELATED APPLICATION

This application claims the priority of application Ser. No. P 41 02 019.7, filed Jan. 24, 1991, in the Federal Republic of Germany, the subject matter of which is incorporated herein by reference.

BACKGROUND OF THE INVENTION

The present invention relates to a metal housing for electronic devices. The housing includes a housing body composed of housing parts that are connected with one another so as to be electrically conductive and leave at least one opening for access to the interior of the housing as well as a closing element for closing the opening and metal contact faces provided at the housing body around the opening and correspondingly at the closing element. These metal contact faces establish a highly electrically conductive connection with one another so as to seal the groove between the housing body and the closing element against interfering electromagnetic radiation. A housing of such a configuration is disclosed, for example, in the published, unexamined German Patent Application No. 3,815,517.

The present invention further relates to a method of producing such a housing.

The operation of electronic devices may be subject to interference from high frequency electromagnetic radiation. Devices employed in the high-frequency art may also themselves radiate electromagnetic waves and thus cause undesirable interference in their environment. To avoid such interferences, the electronic devices must be installed in housings that are tight against high frequencies. Ideally, the electronic devices to be shielded are encased in an uninterrupted sheath of an electrically conductive metal. The Faraday cage formed thereby ensures the desired electromagnetic compatibility (EMC).

However, one or more openings must be provided in the housing to assemble and service the electronic devices. These openings must be closed as tightly as possible by means of an appropriate closing element, for example a door or a flap. The unavoidable grooves between the housing body and the openable closing element adversely affect the shield against the penetration and radiation of electromagnetic waves into and out of the housing interior.

It is known in connection with housings properly constructed for EMC to specially seal the grooves between closing elements and housing body by means of additionally inserted elastic seals of an electrically highly conductive material. For this purpose, mutually corresponding metal contact faces must be provided around the opening in the housing body as well as at the pivotal or removable closing element. A suitable seal composed of an electrically conductive contact strip having resiliently yielding regions is disclosed in the published, unexamined German Patent Application No. 3,642,588. In some cases, such an additional HF seal may not be necessary if it is ensured in some other, for example structural, manner that the contact faces of the housing body and of the closing element lie cleanly against one another.

The electrical transfer resistances between the contact faces and between the contact faces and an inserted HF seal must be as low as possible to realize a high shielding effect for the housing. The higher the conductivity of the materials that are in contact with one another, the lower are the transfer resistances that can be realized. Moreover, it must be ensured that the contact faces remain free of corrosion over the entire service life of the housing.

The published, unexamined German Patent Application No. 3,725,929 discloses a method in which an electrically conductive layer as well as a magnetically permeable material is precipitated by wet chemical means on the surface of a nonmetallic housing - preferably a plastic housing.

German Utility Model Patent No. 86/24,817.0 further discloses a structure composed of a thin polyester sheet as the carrier and a laminated-on aluminum foil as a shield for electronic components.

It is known that EMC housings can also be constructed of aluminum sheets having a bare surface or of stainless steel. If, however, as is generally the custom for reasons of economy, steel sheet is employed, its surface must be provided with a corrosion resistant layer before it is processed. Often HF-tight electronic housings are produced of steel sheet whose surface has been coated with zinc. However, pre-zinced sheets cannot always be processed, for example whenever weld connections ar required to produce the housing. In those cases, a zinc layer must subsequently be additionally applied galvanically, at least in the region of the desired contact faces. Particularly if the housings or housing components have larger dimensions, subsequent zincplating is connected with considerable expenditures.

The use of steel sheets coated with nobler metals than zinc has not been taken into consideration in the past for reasons of cost and also because it would then be difficult to perform the bending and welding processes.

SUMMARY OF THE INVENTION

In view of the above-described drawbacks, it is an object of the present invention to provide an economically manufactured housing for electronic devices which has a high and durable shielding effect against interfering electromagnetic radiation. Additionally, a method will be disclosed for the production of such a housing.

The solution of this problem is based on a housing of the above-mentioned type. According to the characterizing feature of the first claim, the solution resides in that thin contact strips of an electrically highly conductive and corrosion resistant metal are applied to the contact faces. According to the present invention, the noble and expensive contact metal is employed only at those locations where it is actually required, namely in the region of the contact faces. Compared to the use of sheet metal whose entire surface is coated with a metal that is noble compared to steel, this results in considerable savings. It is further of great advantage that the contact strips can be applied only subsequently to the finished housing, thus, after all bending and welding work has been completed.

Preferably, the contact strips are melted or welded onto the less noble carrier material, for example, steel or also aluminum sheet metal. It is sufficient if the thus applied contact strips which are metallurgically fixed to the housing metal have a thickness between 1 and 50 micrometers with a preferred width between 1 and 10 millimeters.

For example, the desired contact strip can be applied to the contact faces in the form of a thin metal foil. In this connection, it has been found to be advisable for the metal foil to be connected with the metal sheet of the housing by means of weld seams only in the region of its longitudinal edges. It is favorable for the use of automatically controlled welding machines that it is sufficient for the weld seams to extend at a slight distance from the longitudinal edges of the metal foil. The welding in the region of the longitudinal edges prevents corrosion from creeping underneath the applied contact strip. In this way, a proper electrical contact between contact strip and carrier sheet is ensured over the entire width of the metal contact faces.

A particularly preferred technology for the subsequent application of the contact strips to the housing is the coating by means of a laser beam.

The surface treatment technology and the application of thin metal layers by means of a laser are known, for example, from the article by W. Hunziker and A. P. Schwarzenbach, entitled "Einfacher arbeiten in jeder Dimension" [Work Easier in Every Dimension], published in *Laser Praxis* [Laser Practice], June, 1990, page 22, or from the article by K. G. Thiemann, H. Ebsen et al, entitled, "Reparaturbeschichten von Turbinenschaufeln" [Repair Coating of Turbine Vanes], published in *Laser Praxis*, October, 1990, page 101.

Additionally, the published, unexamined German Patent Application No. 3,406,256 discloses a method of sealing electromechanical components, particularly relays, in which housing openings are closed by means of a sealing substance that has been melted on by means of a laser beam.

In order to apply a narrow contact strip to the intended location on the housing body or of the closing element, a laser deposition welding process of laying a single weld trace is already sufficient. To obtain broader contact strips, several laser weld traces can be applied in parallel with one another.

Preferred are contact strips composed of a nickel or tin alloy. The application of the desired thin layer may be effected in a two-stage process in which the alloy is initially applied to the carrier material in the cold state, for example by screen printing or spraying, and thereafter this additional material is welded or melted on by means of a laser beam. An alternative hereto is a single-stage coating process in which the material is applied to the substrate surface with the simultaneous action of a laser. The coating material may here be supplied in the form of a paste, wire or powder, directly into the melting region of the laser.

The laser technique is also excellently suited for the subsequent application of a thin metal foil as the contact strip since high precision, program controlled laser welding machines are available today with which, in particular, very thin weld seams can be positioned with extreme accuracy. Thus it is possible without difficulties to subsequently apply a very thin contact strip that has a width of only a few millimeters, for example of a nickel alloy, onto the contact faces of the finished metal housing.

Instead of a laser, the heat required to melt or weld-on the contact strips can also be generated by means of a halogen light source. For example, a thin metal foil may be applied as the contact strip and this foil may then be melted onto the carrier metal by means of halogen light.

For aesthetic reasons and as protection against corrosion, most of the components of a device housing are covered with lacquer. For the EMC housings under discussion here, care must be taken during the application of the lacquer that the metal of the contact faces remains exposed after application of the lacquer. For this purpose, a covering strip is glued in a known manner onto the upper faces of the contact strips and is removed again after the lacquer application. As a further feature of the invention, it is now proposed to melt or spray a thin plastic layer onto the metal surface of the contact strips instead of the manually applied covering strip before the lacquer application to the respective housing component. In this way, another process phase that would otherwise be performed manually can be automatized.

Particularly good protection of the metallurgical connection between the applied contact strips and the carrier metal can be realized if the lacquer layer covers the edges of the contact strips for a piece. This measure reliably prevents the creeping of corrosion underneath the edges of the contact strip. With respect to manufacturing technology, the desired covering of the edges can be realized very easily in that the covering strip applied before the application of the lacquer is somewhat narrower than the contact strip to be protected.

BRIEF DESCRIPTION OF THE DRAWINGS

The invention will now be described in greater detail with reference to the attached drawing figures, in which:

FIGS. 2a to 2d show various embodiments of the contact strips at the housing of FIG. 1a;

FIGS. 3a to 3d show a succession of process steps for the application of contact strips to the housing of FIG. 1a.

DETAILED DESCRIPTION OF THE PREFERRED EMBODIMENTS

Figure 1A:
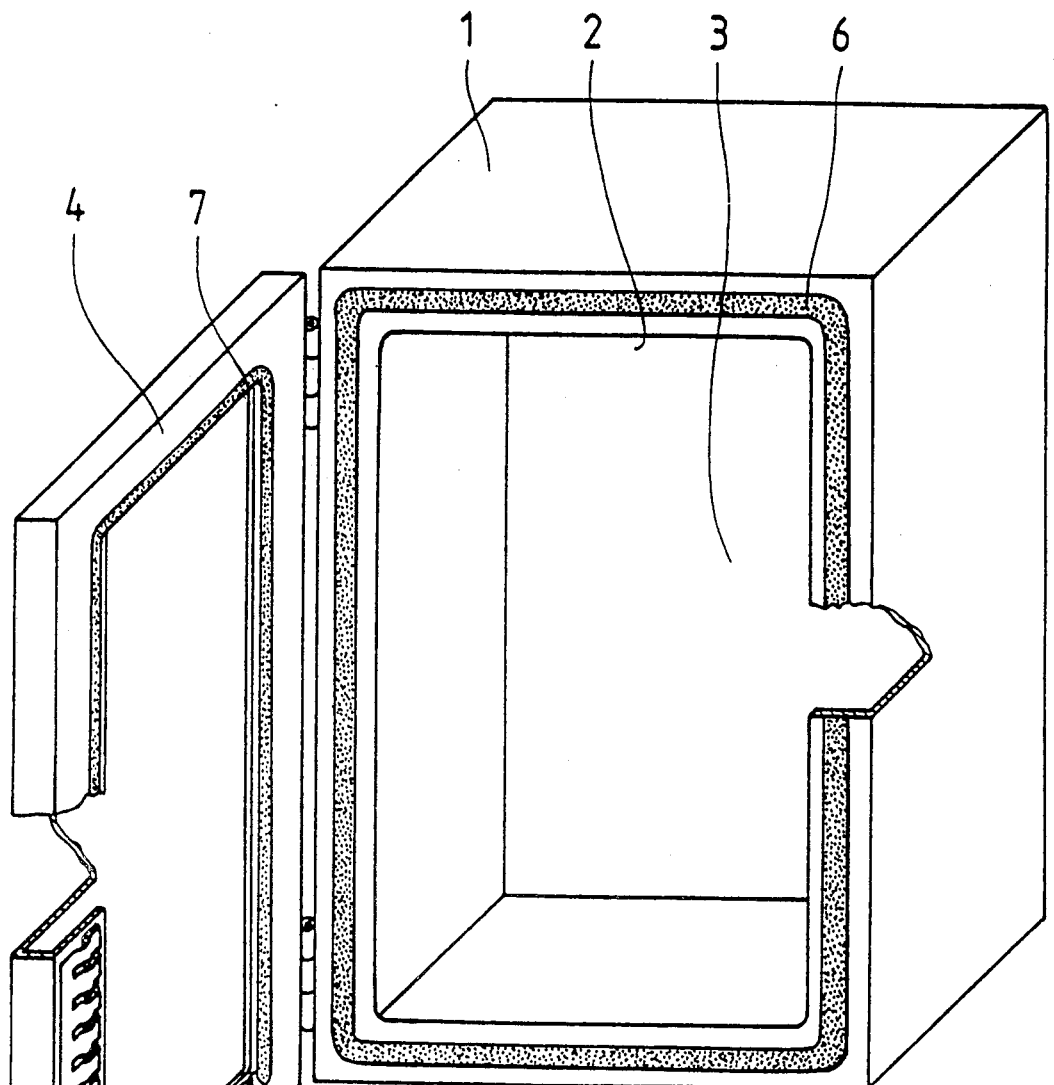
FIG. 1a is a simplified perspective view of an empty housing.

The housing for electronic devices shown schematically in FIG. 1a is essentially composed of a housing body 1 having an opening 2 for access to the interior 3 as well as a pivotal door as the closing element 4 with which opening 3 can be closed. All components of housing body 1 and of closing element 4 are here made of steel sheet. All housing components are electrically conductively connected with one another so that an electronic device accommodated in the interior 3 is shielded against interfering electromagnetic radiation in the sense of a Faraday cage.

Figure 1B:
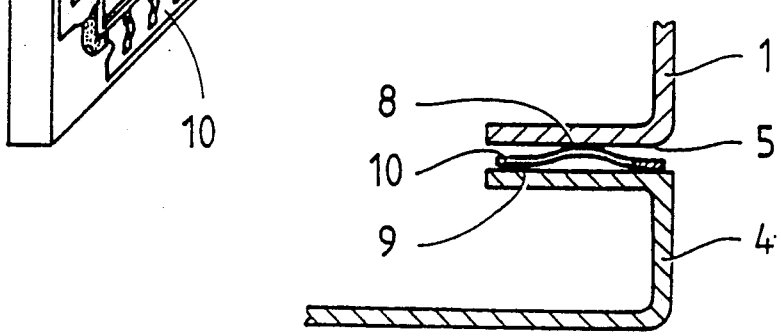
FIG. 1b is a partial horizontal sectional view, to an enlarged scale, through the housing of FIG. 1a in the region of the contact faces.

In the closed state, closing element 4 and the flat edge around the opening 2 of housing body 1 lie flat on top of one another as shown in FIG. 1b. A small groove 5 between housing body 1 and closing element 4 cannot be avoided here. To seal this groove 5 against interfering electromagnetic radiation, a first contact face 6 is formed at housing body 1 around the opening and a corresponding second contact face 7 having bare metal surfaces is formed at closing element 4. Thin contact strips 8 and 9, respectively, of an electrically highly conductive and corrosion resistant metal, here a nickel alloy, are applied to each one of these contact faces 6 and 7. To produce an electrically conductive connection between housing body 1 and closing element 4, an elastic and highly electrically conductive seal 10 is disposed in groove 5, here in the form of a circumferential metal spring contact strip. Over its entire length, seal 10 lies resiliently against the bare metal surface of contact strips 8 and 9, thus compensating any possibly existing dimensional tolerances in the region of groove 5.

FIGS. 2a to 2d show various embodiments of the contact strips 8 and 9 applied to contact faces 6 and 7.

Figure 2A:
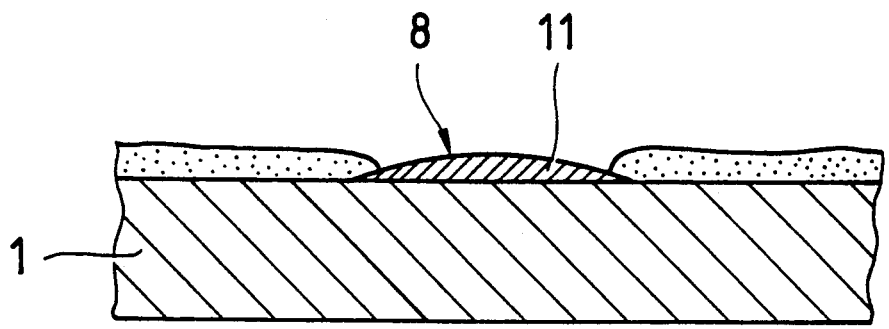

According to FIG. 2a, contact strip 8 is composed of a single weld trace 11 of a nickel alloy that has been applied by means of a laser beam. For this purpose, the material to be applied was introduced in the form of a wire directly into the melting region of the laser beam and was applied to the previously cleaned and degreased, bare metal surface of housing body 1.

Figure 2B:
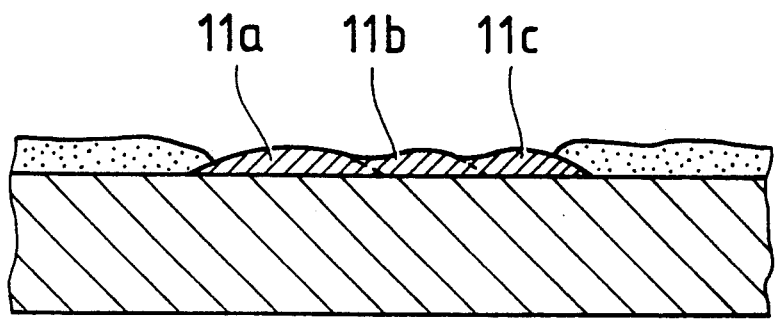

FIG. 2b shows, as an alternative, a broader contact strip 8 formed of three parallel weld traces 11a, 11b and 11c.

Figure 2C:
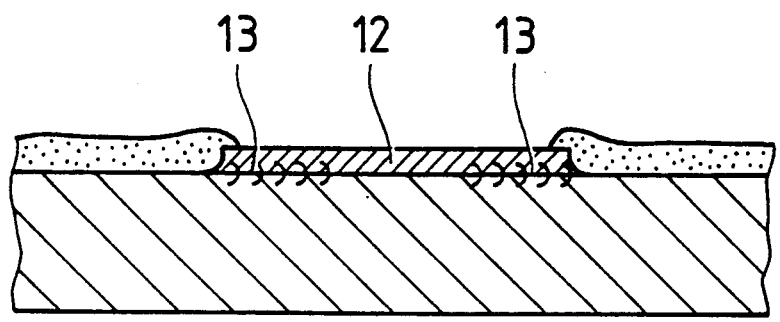

In FIG. 2c, contact strip 8 is composed of a thin metal foil 12 which along its longitudinal edges is connected with the carrier metal by means of weld seams 13.

Figure 2D:
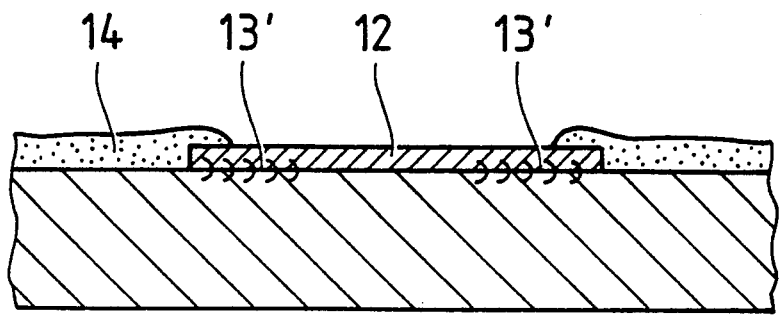

The contact strip 8 of FIG. 2d is also composed of a thin metal foil 12 in which, however, the weld seams 13' applied by means of a laser extend inwardly offset a slight distance from the longitudinal edges. The edges of contact strip 8 and of metal foil 12, respectively, are covered for a bit by a layer of lacquer 14 with which all visible components of housing body 1 and of closing element 4 are coated.

The method of subsequently applying contact strips 8 and 9, respectively, to a housing of steel sheet as shown in FIG. 1a, is shown in FIGS. 3a to 3d.

After cleaning and degreasing of the metal sheets of housing body 1 and of closing element 4, particularly in the region of their contact faces 6 and 7 (see FIG. 1a), a contact strip 8 is welded onto the bare metal contact faces by means of two parallel weld seams 13 along the edges. This is done by means of a program controlled automatic laser welding device.

Thereafter (FIG. 3b), the upper face of the applied contact strip 8 is covered with a removable covering strip 15, for example by spraying on a suitable plastic layer or by manually applying a plastic tape.

Figure 3A:
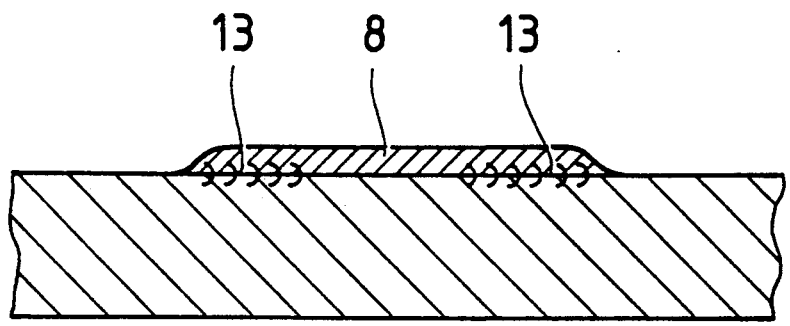
Figure 3B:
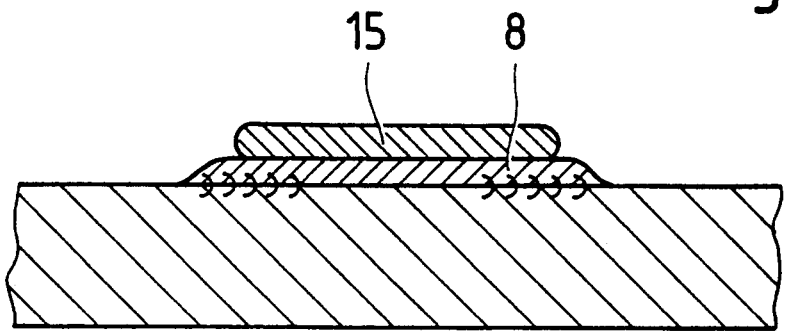
Figure 3C:
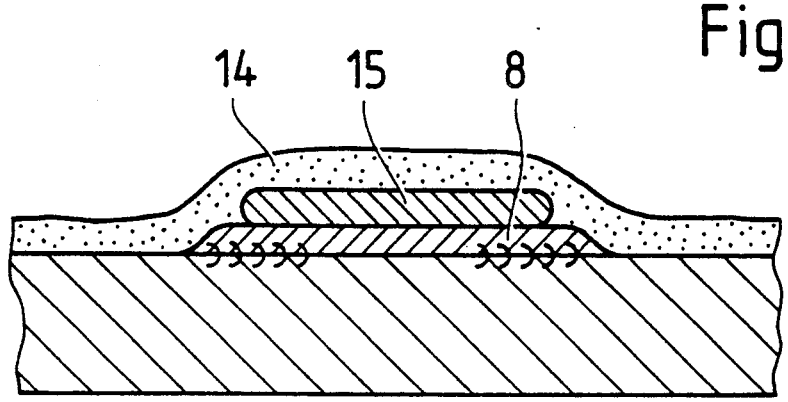

In a further method step shown in FIG. 3c, a lacquer layer 14 is now applied to the entire surface of the sheet metal of housing body 1. The lacquer layer 14 then also covers contact strip 8 which is protected by covering strip 15.

Figure 3D:
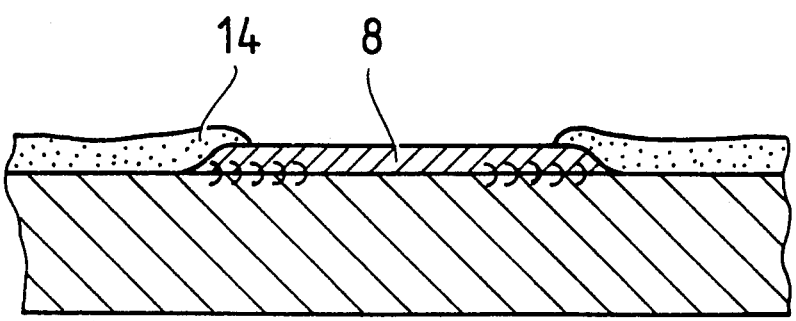

FIG. 3d shows housing body 1 in the region of contact face 6 (see FIG. 1a) after covering strip 15 has been removed so that the metal surface of contact strip 8 is exposed again. Since a covering strip 15 was employed which is a little narrower than the applied contact strip 8, the edges of contact strip 8 are covered for a piece by lacquer layer 14 in the region of weld seams 13 in order to preclude the future creeping of corrosion underneath contact strip 8 from the edges.

It will be understood that the above description of the present invention is susceptible to various modifications, changes and adaptations, and the same are intended to be comprehended within the meaning and range of equivalents of the appended claims.

What is claimed is:

1. A metal housing for electronic devices, the housing including
    a housing body composed of electrically conductively interconnected housing components and provided with at least one opening for access to the interior of the housing;
    a closing element which closes the opening;
    metal contact faces provided at the housing body around the opening as well as corresponding contact faces provided at a closing element for sealing the groove between the housing body and the closing element against interfering electromagnetic radiation and provide a good electrically conductive connection, characterized in that thin contact strips of a metal that is more electrically conductive and more corrosion resistant than the metal of the housing are applied to the contact faces.

2. A housing as defined in claim 1, wherein the contact strips are melted on.

3. A housing as defined in claim 1, wherein the contact strips are welded on.

4. A housing as defined in claim 1, wherein the contact strips have a thickness between 1 and 100 micrometers.

5. A housing as defined in claim 1, wherein the contact strips have a width between 1 and 10 millimeters.

6. A housing as defined in claim 1, wherein the contact strips are applied in the form of a thin metal foil.

7. A housing as defined in claim 6 wherein the metal foil is connected with the metal sheet forming the housing by means of weld seams only in the region of its longitudinal edges.

8. A housing as defined in claim 7, wherein the weld seams extend at a slight distance from the longitudinal edges of the metal foil.

9. A housing as defined in claim 1, wherein the contact strips are deposition welded.

10. A housing as defined in claim 9, wherein the contact strips are formed of a plurality of parallel extending weld traces.

11. A housing as defined in claim 1, wherein the contact strips are composed of a nickel alloy.

12. A housing as defined in claim 1, wherein the contact strips are composed of a tin alloy.

13. A housing as defined in claim 1 made of a lacquered metal sheet, wherein the edges of the contact strips are covered by the lacquer layer.

14. A housing as defined in claim 1, wherein an elastic and highly electrically conductive seal is disposed in the groove between the housing body and the closing element so as to provide an electrically conductive connection between the metal and corresponding contact faces.

15. A housing as defined in claim 14, wherein the seal is configured as a metal spring contact strip.

16. A housing as defined in claim 14, wherein the seal is composed of a rubber elastic material.

* * * * *